United States Patent
Ding et al.

(10) Patent No.: US 10,318,787 B2
(45) Date of Patent: Jun. 11, 2019

(54) FINGERPRINT PHOTOCURRENT DETECTION UNIT, FINGERPRINT IDENTIFIER, DRIVING METHOD AND DISPLAY DEVICE

(71) Applicant: BOE TECHNOLOGY GROUP CO., LTD., Beijing (CN)

(72) Inventors: Xiaoliang Ding, Beijing (CN); Xue Dong, Beijing (CN); Jing Lv, Beijing (CN); Haisheng Wang, Beijing (CN); Chunwei Wu, Beijing (CN); Yingming Liu, Beijing (CN); Wei Liu, Beijing (CN); Pengpeng Wang, Beijing (CN); Yanling Han, Beijing (CN); Xueyou Cao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/768,218

(22) PCT Filed: Sep. 11, 2017

(86) PCT No.: PCT/CN2017/101222
§ 371 (c)(1),
(2) Date: Apr. 13, 2018

(87) PCT Pub. No.: WO2018/050035
PCT Pub. Date: Mar. 22, 2018

(65) Prior Publication Data
US 2018/0314872 A1    Nov. 1, 2018

(30) Foreign Application Priority Data

Sep. 18, 2016 (CN) ............ 2016 1 0829135

(51) Int. Cl.
*G06K 9/00* (2006.01)
*H01L 27/00* (2006.01)
(Continued)

(52) U.S. Cl.
CPC ....... *G06K 9/0004* (2013.01); *G06K 9/00523* (2013.01); *H01L 27/1222* (2013.01); *H01L 27/14678* (2013.01); *H01L 29/78672* (2013.01)

(58) Field of Classification Search
CPC .......... G06K 9/0004; G06K 9/00523; G06F 3/0412; H01L 29/78672; H01L 27/14678; H01L 27/1222
(Continued)

(56) References Cited

U.S. PATENT DOCUMENTS 4,794,260 A * 12/1988 Asano ............... A61B 5/1172
                                                250/458.1
9,740,343 B2 * 8/2017 Hotelling ............ G06F 3/044
(Continued)

FOREIGN PATENT DOCUMENTS

| CN | 101520837 A | 9/2009 |
| CN | 103761002 A | 4/2014 |

(Continued)

OTHER PUBLICATIONS

International Search Report and Written Opinion for Application No. PCT/CN2017/101222, dated Nov. 29, 2017, 9 Pages.
(Continued)

*Primary Examiner* — Seung C Sohn
(74) *Attorney, Agent, or Firm* — Brooks Kushman P.C.

(57) ABSTRACT

The present disclosure provides a fingerprint photocurrent detection unit, a fingerprint identifier, a driving method and a display device. The fingerprint photocurrent detection unit includes: a conversion circuit coupled to a fingerprint photocurrent reading line and configured to convert a fingerprint (Continued)

photocurrent acquired by the fingerprint photocurrent reading line into a square wave signal; and a detection circuit coupled to the conversion circuit and configured to detect the square wave signal and acquire information about a fingerprint photocurrent in accordance with a frequency of the square wave signal.

17 Claims, 4 Drawing Sheets

(51) Int. Cl.
  *H01L 27/12*     (2006.01)
  *H01L 27/146*    (2006.01)
  *H01L 29/786*    (2006.01)

(58) Field of Classification Search
  USPC ............................. 250/208.1, 458.1, 222.1
  See application file for complete search history.

(56) References Cited

U.S. PATENT DOCUMENTS

| | | | |
|---|---|---|---|
| 9,965,667 B2* | 5/2018 | Du | G06K 9/0002 |
| 2015/0254491 A1 | 9/2015 | Mo et al. | |
| 2016/0364595 A1 | 12/2016 | Du et al. | |
| 2017/0060321 A1* | 3/2017 | Jeong | G06F 3/0416 |
| 2017/0255810 A1 | 9/2017 | Liu et al. | |

FOREIGN PATENT DOCUMENTS

| | | |
|---|---|---|
| CN | 104516716 A | 4/2015 |
| CN | 104573649 A | 4/2015 |
| CN | 105373772 A | 3/2016 |
| CN | 105426865 A | 3/2016 |
| CN | 105913055 A | 8/2016 |
| CN | 105930827 A | 9/2016 |
| CN | 106469303 A | 3/2017 |

OTHER PUBLICATIONS

First Office Action for Chinese Patent Application No. 201610829135.8, dated Jan. 8, 2019, 8 Pages.

* cited by examiner

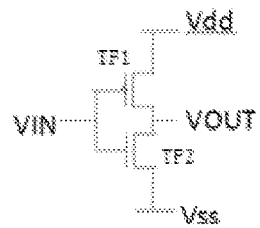

Fig. 3B

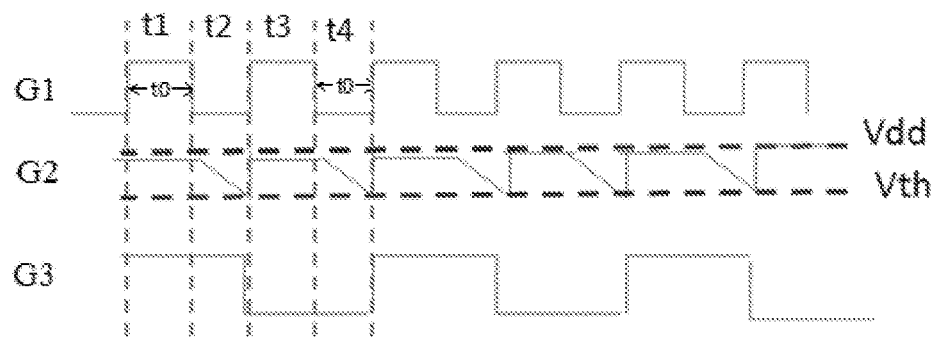

Fig. 4

| at a charging stage, controlling, by a detection control module, a potential at the first node to be a first level and a potential at a third node to be a high level or a low level, and controlling, by a first switching module, a high level line to be electrically connected to a second node, so as to charge a storage module and pull up a potential at the second node to the high level | S1 |

| at a discharging stage, controlling, by the detection control module, the potential at the first node to be jumped to a second level, controlling, by the first switching module, the high level line to be electrically disconnected from the second node so as to enable a fingerprint photocurrent to flow from the second node, through a fingerprint photocurrent reading line and toward a reversely-biased photosensitive diode of a fingerprint touch unit and pull down the potential at the second node gradually until the second switching module is turned on, controlling, by a phase conversion module, the potential at the third node to be jumped to the low level or high level, controlling, by the detection control module, the potential at the first node to be reset as the first level, and acquiring, by a detection circuit, corresponding information about a fingerprint photocurrent in accordance with a frequency of a waveform of a potential at an output end of the phase inversion module and/or a frequency of a waveform of the potential at the first node | S2 |

Fig. 5

FINGERPRINT PHOTOCURRENT DETECTION UNIT, FINGERPRINT IDENTIFIER, DRIVING METHOD AND DISPLAY DEVICE

CROSS-REFERENCE TO RELATED APPLICATION APPLICATIONS

This application is the U.S. national phase of PCT Application No. PCT/CN2017/101222 filed on Sep. 11, 2017, which claims priority to Chinese Patent Application No. 201610829135.8 filed on Sep. 18, 2016, which are incorporated herein by reference in their entireties.

TECHNICAL FIELD

The present disclosure relates to the field of fingerprint photocurrent identification technology, in particular to a fingerprint photocurrent detection unit, a fingerprint identifier, a driving method and a display device.

BACKGROUND

Recently, along with the rapid development of the technology, mobile products having a biometric identification function have been gradually used in our daily lives. Fingerprint technology has attracted more and more attentions due to the uniqueness of fingerprint. Push-type and swipe-type fingerprint identification techniques manufactured using a silicon-based process have been integrated into the mobile products, and in future, the focus is on the fingerprint identification technique at a display region.

In a fingerprint current identification circuit in the related art, each fingerprint sensor consists of one photosensitive diode and one switching transistor. In the case of scanning the fingerprint, light beams from a light source may be reflected by valleys and ridges of the fingerprint in different ways, so an intensity of the light beams received by the photosensitive diode may change, resulting in different photocurrents. Under the control of the switching transistor, the photocurrents flowing through the photosensitive diodes may be read, so as to detect the valleys and ridges of the fingerprint. However, for a conventional fingerprint photocurrent detection method, the fingerprint photocurrent is directly detected, so an intensity of a signal is relatively low and a noise may easily interfere with the signal.

SUMMARY

A main object of the present disclosure is to provide a fingerprint photocurrent detection unit, a fingerprint identifier, a driving method and a display device, so as to increase the intensity of the signal and prevent the noise from interfering with the signal as compared with the related art where the fingerprint photocurrent is directly detected using the conventional fingerprint photocurrent detection method.

In one aspect, the present disclosure provides in some embodiments a fingerprint photocurrent detection unit, including: a conversion circuit coupled to a fingerprint photocurrent reading line and configured to convert a fingerprint photocurrent acquired by the fingerprint photocurrent reading line into a square wave signal; and a detection circuit coupled to the conversion circuit and configured to detect the square wave signal and acquire information about a fingerprint photocurrent in accordance with a frequency of the square wave signal.

In a possible embodiment of the present disclosure, the conversion circuit includes a detection control module, a first switching module, a second switching module, a phase inversion module and a storage module. A control end of the first switching module is coupled to the detection control module and a first node, a first end thereof is coupled to a high level line, and a second end thereof is coupled to a control end of the second switching module. The first switching module is configured to be turned on in the case that a potential at the first node is a first level, and turned off in the case that the potential at the first node is a second level. A first end of the storage module is coupled to the second end of the first switching module, and a second end thereof is coupled to a low level line. The control end of the second switching module is further coupled to the fingerprint photocurrent reading line and a second node, a first end thereof is coupled to an output end of the phase inversion module, and a second end thereof is coupled to an input end of the phase inversion module. The second switching module is configured to be turned on in the case that a potential at the second node is a low level, and turned off in the case that the potential at the second node is a high level. The output end of the phase inversion module is further coupled to a third node, and the phase inversion module is configured to invert a phase of a level applied to its input end and output a signal with the inverted phase. The detection control module is coupled to the first node and the output end of the phase inversion module, and configured to, in the case that a detection operation starts and the signal from the output end of the phase inversion module is at a rising or falling edge, control the potential at the first node to be the first level, in the case that the potential at the first node is maintained as the first level for a predetermined time period, control the potential at the first node to jump to the second level, and in the case that the detection operation starts, control the potential at the third node to be the high level or the low level. The detection circuit is coupled to the output end of the phase inversion module and/or the first node, and further configured to detect a frequency of a waveform of a potential at the output end of the phase inversion module and/or a frequency of a waveform of the potential at the first node, and acquire the information about the fingerprint photocurrent in accordance with the frequency of the waveform of the potential at the output end of the phase inversion module and the frequency of the waveform of the potential at the first node.

In a possible embodiment of the present disclosure, the first switching module includes a first switching transistor, a gate electrode of which is coupled to the detection control module and the first node, a first electrode of which is coupled to the high level line, and a second electrode of which is coupled to the second node. The second switching module includes a second switching transistor, a, gate electrode of which is coupled to the fingerprint photocurrent reading line and the second node, a first electrode of which is coupled to the output end of the phase inversion module, and a second electrode of which is coupled to the input end of the phase inversion module. The storage module includes a storage capacitor, a first end of which is coupled to the second node, and a second end of which is coupled to the low level line. The phase inversion module includes A phase inverters coupled in series to each other, where A is an odd number and a positive integer. An output end of an $a^{th}$ phase inverter is coupled to an input end of an $(a+1)^{th}$ phase inverter, where a is an integer greater than or equal to 1 and smaller than A. An input end of a first phase inverter is the input end of the phase inversion module, and an output end of an $A^{th}$ phase inverter is the output end of the phase inversion module.

In a possible embodiment of the present disclosure, in the case that the first switching transistor is an n-type transistor and the second switching transistor is a p-type transistor, the first level is a high level and the second level is a low level, or in the case that the first switching transistor and the second switching transistor are both p-type transistors, the first level is a low level and the second level is a high level.

In a possible embodiment of the present disclosure, the detection control module includes an edge trigger and a signal controller. An edge triggering end of the edge trigger is coupled to the output end of the phase inversion module, and an output end thereof is coupled to the first node. The edge trigger is configured to, in the case that the detection operation starts, control the potential at the third node to be the high level or low level, and in the case that the signal from the output end of the phase inversion module is at the rising edge or falling edge, control the potential at the first node to be the first level. The signal controller is coupled to the first node, and configured to, in the case that the detection operation starts, control the potential at the first node to be the first level, and in the case that the potential at the first node is maintained as the first level for the predetermined time period, control the potential at the first node to jump to the second level.

In another aspect, the present disclosure provides in some embodiments a method for driving the above-mentioned fingerprint photocurrent detection unit, including steps of: at a charging stage, controlling, by a detection control module, a potential at the first node to be a first level and a potential at a third node to be a high level or a low level, and controlling, by a first switching module, a high level line to be electrically coupled to a second node, so as to charge a storage module and pull up a potential at the second node to the high level; and at a discharging stage, controlling, by the detection control module, the potential at the first node to jump to a second level, controlling, by the first switching module, the high level line to be electrically decoupled from the second node so as to enable a fingerprint photocurrent to flow from the second node, through a fingerprint photocurrent reading line and toward a reversely-biased photosensitive diode of a fingerprint sensing unit and pull down the potential at the second node gradually until the second switching module is turned on, controlling, by a phase conversion module, the potential at the third node to jump to the low level or high level, controlling, by the detection control module, the potential at the first node to be reset as the first level, and acquiring, by a detection circuit, corresponding information about a fingerprint photocurrent in accordance with a frequency of a waveform of a potential at an output end of the phase inversion module and/or a frequency of a waveform of the potential at the first node.

In yet another aspect, the present disclosure provides in some embodiments a fingerprint identifier, including fingerprint photocurrent reading lines and the above-mentioned fingerprint photocurrent detection unit. A conversion circuit of the fingerprint photocurrent detection unit is coupled to the fingerprint photocurrent reading lines.

In a possible embodiment of the present disclosure, the fingerprint photocurrent reading lines are arranged in m columns, and the fingerprint identifier further includes fingerprint sensing units arranged in n rows and m columns, where n and m are both positive integers. Each fingerprint sensing unit includes a reading control transistor and a photosensitive diode. An anode of the photosensitive diode is coupled to a low level output end, and a cathode thereof is coupled to a first electrode of the reading control transistor. Gate electrodes of the reading control transistors of the fingerprint sensing units in each row are coupled to a corresponding gate line, and second electrodes of the reading control transistors of the fingerprint sensing units in each column are coupled to a corresponding fingerprint photocurrent reading line.

In a possible embodiment of the present disclosure, the fingerprint identifier further includes a multiplexer, an input end of which is coupled to the fingerprint photocurrent reading lines arranged in m columns, an output end of which is coupled to a control end of a second switching module of the fingerprint photocurrent detection unit, and a control end of which is coupled to a multiplex control line. The multiplexer is configured to control the fingerprint photocurrent reading lines arranged in m columns to be electrically coupled to the control end of the second switching module in a time-division manner under the control of a multiplex control signal from the multiplex control line.

In still yet another aspect, the present disclosure provides in some embodiments a method for driving the above-mentioned fingerprint identifier, including: a connection step of controlling, by a multiplexer, fingerprint photocurrent reading lines arranged in m columns to be electrically coupled to a control end of a second switching module in a time-division manner under the control of a multiplex control signal; and a fingerprint photocurrent detection step of detecting, by a fingerprint photocurrent detection unit, information about a fingerprint photocurrent from the fingerprint photocurrent reading line coupled to the fingerprint photocurrent detection unit.

In still yet another aspect, the present disclosure provides in some embodiments a display device including a display substrate and the above-mentioned fingerprint identifier arranged on the display substrate.

In a possible embodiment of the present disclosure, the display substrate is a Low Temperature Poly-Silicon (LTPS) display substrate, and the fingerprint identifier is arranged on the display substrate through an LTPS process.

In a possible embodiment of the present disclosure, the display device further includes N groups fingerprint photocurrent reading lines arranged at an active display region of the display substrate, and each group of fingerprint photocurrent reading lines include the fingerprint photocurrent reading lines arranged in m columns, where m and N are both positive integers. There are N fingerprint identifiers, and each fingerprint identifier is coupled to the fingerprint photocurrent reading lines arranged in m columns.

BRIEF DESCRIPTION OF THE DRAWINGS

FIG. 3B is a schematic view showing a phase inverter in FIG. 3A;

FIG. 4 is a sequence diagram of the conversion circuit in FIG. 3A;

FIG. 5 is a flow chart of a method for driving the fingerprint photocurrent detection unit according to one embodiment of the present disclosure;

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Figure 1:
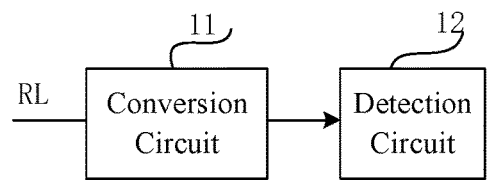
FIG. 1 is a schematic view showing a fingerprint photocurrent detection unit according to one embodiment of the present disclosure.

As shown in FIG. 1, the present disclosure provides in some embodiments a fingerprint photocurrent detection unit, which includes: a conversion circuit 11 coupled to a fingerprint photocurrent reading line RL and configured to convert a fingerprint photocurrent acquired by the fingerprint photocurrent reading line RL into a square wave signal; and a detection circuit 12 coupled to the conversion circuit and configured to detect the square wave signal and acquire information about a fingerprint photocurrent in accordance with a frequency of the square wave signal.

According to the fingerprint photocurrent detection unit in the embodiments of the present disclosure, the fingerprint photocurrent acquired by the fingerprint photocurrent reading line is converted into the corresponding square ware signal through the conversion circuit, i.e., during the optical fingerprint detection, the detection of an electrical physical quantity is converted into the detection of the frequency. Through the frequency detection, it is able to increase an intensity of the signal, thereby to prevent a noise from interfering with the signal.

Figure 2:
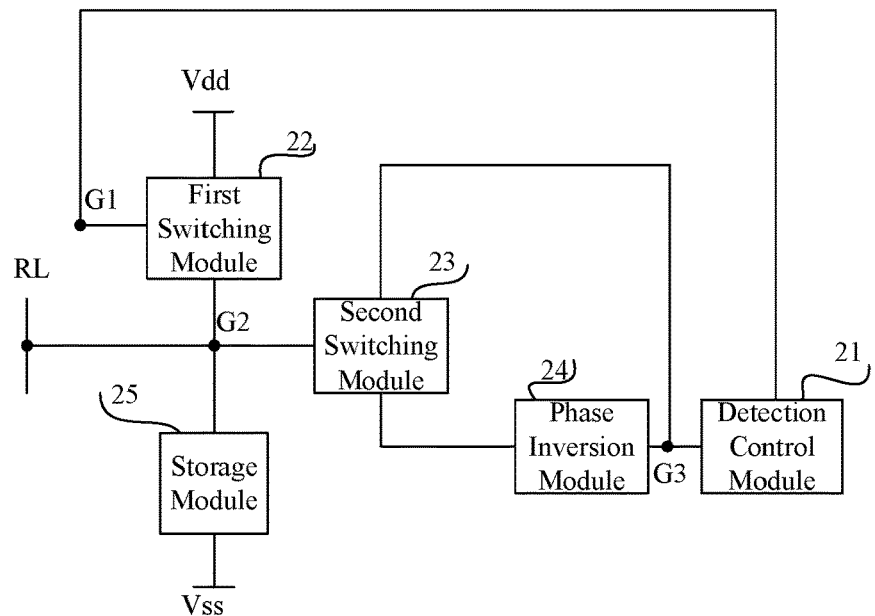
FIG. 2 is a schematic view showing a conversion circuit of the fingerprint photocurrent detection unit according to one embodiment of the present disclosure.

To be specific, as shown in FIG. 2, the conversion circuit may include a detection control module 21, a first switching module 22, a second switching module 23, a phase inversion module 24 and a storage module 25.

A control end of the first switching module 22 is coupled to the detection control module 21 via a first node G1, a first end thereof is coupled to a high level line for outputting a high level Vdd, and a second end thereof is coupled to a control end of the second switching module 23. The first switching module 22 is configured to be turned on in the case that a potential at the first node G1 is a first level and turned off in the case that the potential at the first node G1 is a second level.

A first end of the storage module 25 is coupled to the second end of the first switching module 22, and a second end thereof is coupled to a low level line for outputting a low level Vss.

The control end of the second switching module 23 is further coupled to the fingerprint photocurrent reading line RL via a second node G2, a first end thereof is coupled to an output end of the phase inversion module 24, and a second end thereof is coupled to an input end of the phase inversion module 24. The second switching module 23 is configured to be turned on in the case that a potential at the second node G2 is a low level, and turned off in the case that the potential at the second node G2 is a high level.

The output end of the phase inversion module 24 is further coupled to a third node G3, and the phase inversion module 24 is configured to invert a phase of a level applied to its input end and output an inverted signal.

The detection control module 21 is coupled to the first node G1 and the output end of the phase inversion module 24, and configured to, in the case that a detection operation starts and the signal from the output end of the phase inversion module 24 is at a rising or falling edge, control the potential at the first node G1 to be the first level, in the case that the potential at the first node G1 is maintained as the first level for a predetermined time period, control the potential at the first node G1 to jump to the second level, and in the case that the detection operation starts, control the potential at the third node G3 to be the high level or the low level.

The detection circuit 12 is coupled to the output end of the phase inversion module 24 and/or the first node G1, and further configured to detect a frequency of a waveform of a potential at the output end of the phase inversion module 24 and/or a frequency of a waveform of the potential at the first node G1, and acquire the information about the fingerprint photocurrent in accordance with information about the waveforms.

In actual use, the predetermined time period may be set in accordance with the practical need, and its value will not be particularly defined herein.

Figure 6:
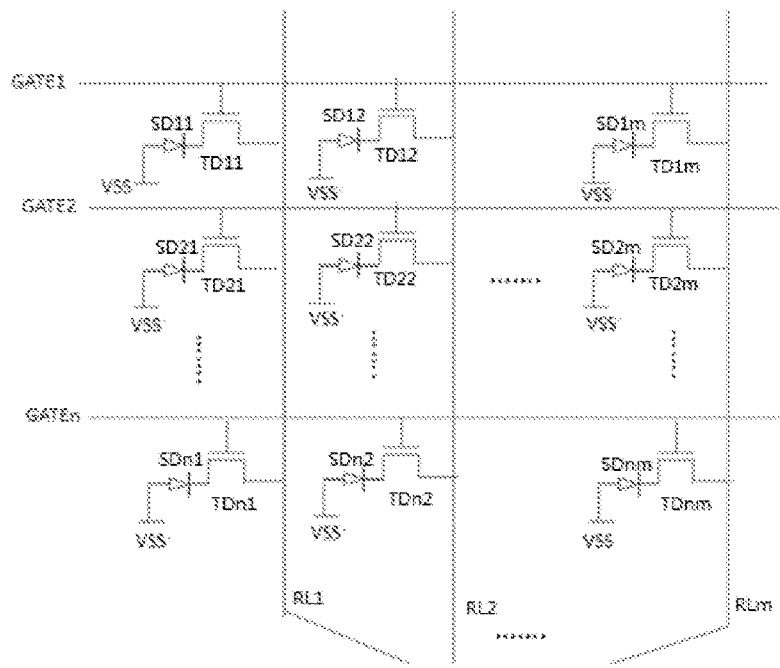
FIG. 6 is a schematic view showing a fingerprint identifier according to one embodiment of the present disclosure.
Figure 7:
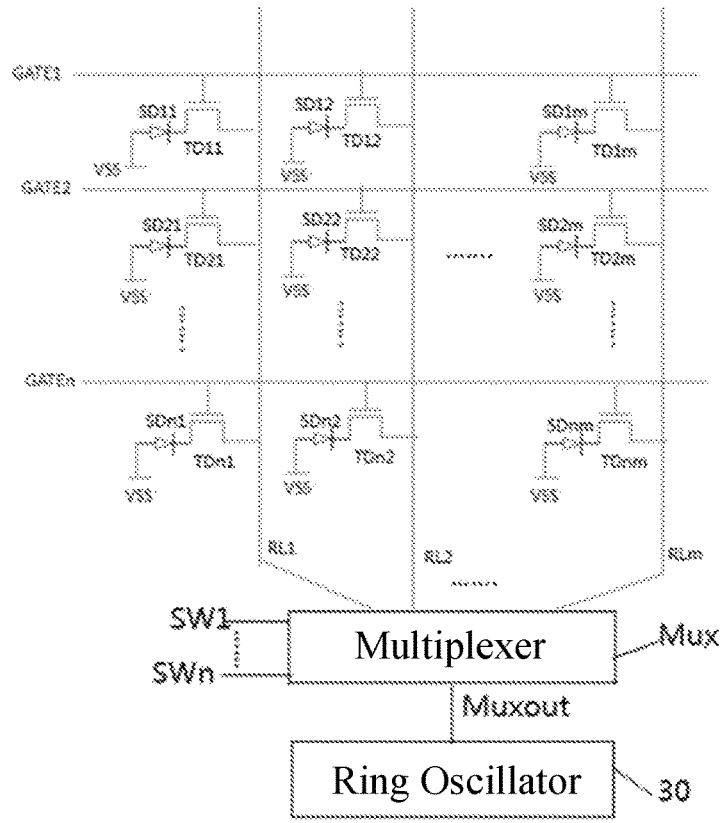
FIG. 7 is another schematic view showing the fingerprint identifier according to one embodiment of the present disclosure.

During the implementation, the fingerprint photocurrent reading line RL is coupled to a plurality of fingerprint sensing units, so as to read the fingerprint photocurrents acquired by the plurality of fingerprint sensing units in a time-division manner. In a possible embodiment of the present disclosure, as shown in FIG. 6 or 7, each fingerprint sensing unit may include a reading control transistor and a photosensitive diode. An anode of the photosensitive diode is coupled to a low level output end, and a cathode thereof is coupled to a first electrode of the reading control transistor. A gate electrode of the reading control transistor is coupled to a corresponding gate line, and a second electrode thereof is coupled to the fingerprint photocurrent reading line.

During the operation of the fingerprint photocurrent detection unit in FIG. 2, at a charging stage, the detection control module 21 may control the potential at the first node G1 to be the first level and control the potential at the third node G3 to be a high level or a low level, and the first switching module 22 may control the high level line to be electrically coupled to the second node G2, so as to charge the storage module 25 and pull up the potential at the second node G2 to the high level.

At the discharging stage, the detection control module 21 may control the potential at the first node G1 to jump to the second level, and the first switching module 22 may control the high level line to be electrically decoupled from the second node G2, so as to enable the fingerprint photocurrent to flow from the second node G2, through the fingerprint photocurrent reading line RL and toward the reversely-biased photosensitive diode of the fingerprint sensing unit, and as shown in FIG. 6 or 7, pull down the potential at the second node G2 gradually until the second switching module 23 is turned on. The phase conversion module 24 may control the potential at the third node G3 to jump to the low level or high level, the detection control module 21 may control the potential at the first node G1 to be reset as the first level, and the detection circuit 12 may acquire the corresponding information about the fingerprint photocurrent in accordance with the frequency of the waveform of the potential at the output end of the phase inversion module and/or the frequency of the waveform of the potential at the first node.

In actual use, the first switching module may include a first switching transistor, a gate electrode of which is coupled to the detection control module and the first node, a first electrode of which is coupled to the high level line, and a second electrode of which is coupled to the second node.

The second switching module may include a second switching transistor, a, gate electrode of which is coupled to the fingerprint photocurrent reading line and the second node, a first electrode of which is coupled to the output end of the phase inversion module, and a second electrode of which is coupled to the input end of the phase inversion module.

The storage module may include a storage capacitor, a first end of which is coupled to the second node, and a second end of which is coupled to the low level line.

The phase inversion module includes A phase inverters coupled in series to each other, where A is an odd number and a positive integer.

An output end of an a' phase inverter is coupled to an input end of an $(a+1)^{th}$ phase inverter, where a is an integer greater than or equal to 1 and smaller than A.

An input end of a first phase inverter is the input end of the phase inversion module, and an output end of an $A^{th}$ phase inverter is the output end of the phase inversion module.

To be specific, in the case that the first switching transistor is an n-type transistor and the second switching transistor is a p-type transistor, the first level is a high level and the second level is a low level, or in the case that the first switching transistor and the second switching transistor are both p-type transistors, the first level is a low level and the second level is a high level.

All transistors adopted in the embodiments of the present disclosure may be thin film transistors, field effect transistors or any other elements having an identical characteristic. In the embodiments of the present disclosure, in order to differentiate two electrodes, except the gate electrode, of each transistor from each other, one of them is called as the first electrode and the other is called as the second electrode. In the case that the first electrode is a source electrode, the second electrode is a drain electrode, and in the case that the first electrode is a drain electrode, the second electrode is a source electrode.

To be specific, the detection control module includes an edge trigger and a signal controller.

An edge triggering end of the edge trigger is coupled to the output end of the phase inversion module, and an output end thereof is coupled to the first node. The edge trigger is configured to, in the case that the signal from the output end of the phase inversion module is at the rising edge or falling edge, control the potential at the first node to be the first level.

The signal controller is coupled to the first node, and configured to, in the case that the detection operation starts, control the potential at the first node to be the first level, and in the case that the potential at the first node is maintained as the first level for the predetermined time period, control the potential at the first node to jump to the second level.

In a possible embodiment of the present disclosure, the edge trigger and the signal controller may each be provided, or embodied, as an Integrated Circuit (IC).

The conversion circuit of the fingerprint photocurrent detection unit will be described hereinafter in more details.

Figure 3A:
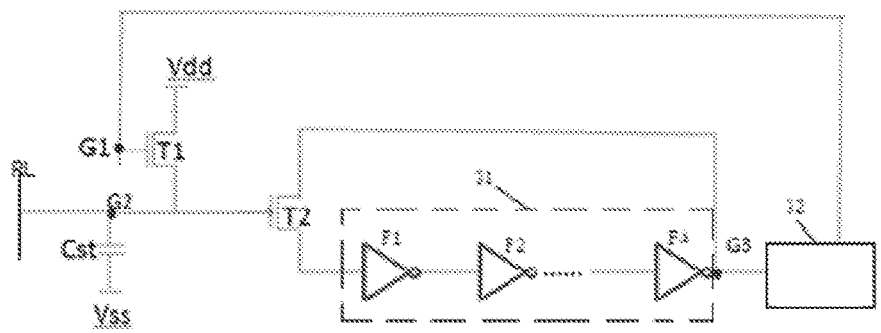
FIG. 3A is a circuit diagram of the conversion circuit of the fingerprint photocurrent detection unit according to one embodiment of the present disclosure.

As shown in FIG. 3A, the conversion circuit of the fingerprint photocurrent detection unit may include a detection control module, a first switching module, a second switching module, a phase inversion module 31 and a storage module.

The first switching module may include a first switching transistor T1, a gate electrode of which is coupled to an output end of an edge trigger 32 of the detection control module via the first node G1, a drain electrode of which is coupled to the high level line for outputting the high level Vdd, and a source electrode of which is coupled to the second node G2. The first switching transistor T1 may be an n-type transistor.

The second switching module may include a second switching transistor T2, a, gate electrode of which is coupled to the fingerprint photocurrent reading line RL via the second node G2, a source electrode of which is coupled to an input end of the phase inversion module 31, and a drain electrode of which is coupled to an output end of the phase inversion module 31. The second switching transistor T2 may be a p-type transistor.

The storage module may include a storage capacitor Cst, a first end of which is coupled to the second node G2, and a second end of which is coupled to the low level line for outputting the low level Vss.

The phase inversion module 31 may include A phase inverters coupled in series to each other, where A is an odd number and a positive integer. An output end of an $a^{th}$ phase inverter is coupled to an input end of an $(a+1)^{th}$ phase inverter, where a is an integer greater than or equal to 1 and smaller than A.

An input end of a first phase inverter F1 is the input end of the phase inversion module 31, and an output end of an $A^{th}$ phase inverter FA is the output end of the phase inversion module 31.

Figure 10:
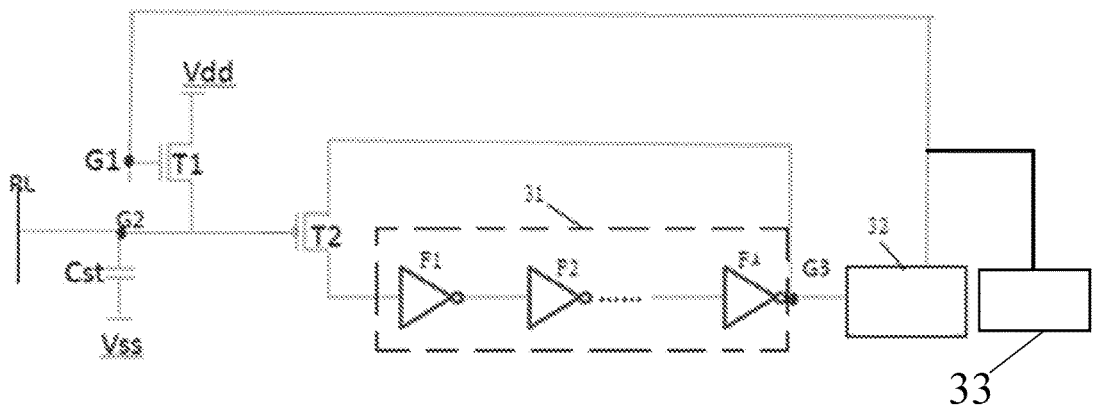
FIG. 10 is a circuit diagram of the conversion circuit of the fingerprint photocurrent detection unit according to one embodiment of the present disclosure.

The detection control module may include an edge trigger 32 and a signal controller 33 (as shown in FIG. 10). An edge triggering end of the edge trigger 32 is coupled to the output end of the phase inversion module 31, and an output end thereof is coupled to the first node G1.

The edge trigger 32 is configured to, in the case that the detection operation starts, control the potential at the third node G3 to be the high level (in actual use, the edge trigger 32 may also be configured to control the potential at the third node G3 to be the low level), and in the case that the signal from the output end of the phase inversion module 31 is at the rising edge or falling edge, control the potential at the first node G1 to be the high level.

The signal controller is coupled to the first node G1, and configured to, in the case that the detection operation starts, control the potential at the first node G1 to be the high level, and in the case that the potential at the first node G1 is maintained as the high level for the predetermined time period, control the potential at the first node G1 to jump to the low level.

In FIG. 3A, F1 represents the first phase inverter, F2 represents a second phase inverter, and FA represents the $A^{th}$ phase inverter.

The conversion circuit in FIG. 3A is equivalent to a ring oscillator. In actual use, the ring oscillator may be arranged through an LTPS process, and it may be arranged beyond the active display region (region AA in FIG. 9).

FIG. 3B shows a structure of each phase inverter in FIG. 3A. In FIG. 3B, TF1 represents a first phase inversion transistor, TF2 refers to a second phase inversion transistor, Vdd represents a high level, Vss represents a low level, VIN represents an input voltage, and VOUT represents an output voltage. The first phase inversion transistor TF1 is a P-Metal-Oxide-Semiconductor (PMOS) transistor, and the second phase inversion transistor TF2 is an N-Metal-Oxide-Semiconductor (NMOS) transistor.

During the operation of the conversion circuit in FIG. 3A, as shown in FIG. 4, each period includes four stages. The following description will be given by taking a first period as an example.

At a first stage t1 of the first period, the signal controller (as shown in FIG. 10) may pull up the potential at G1, so as to turn on T1, charge Cst, pull up the potential at G2 to Vdd, and pull up (merely within the first period) the potential at G3 to be a high level through the edge trigger 32. The signal controller may maintain the potential at G1 at the high level for a predetermined time period t0 before a second stage.

At the second stage t2, the signal controller (as shown in FIG. 10) may control the potential at G1 to be the low level, so as to turn off T1. At this time, the photosensitive diode coupled to RL via the reading transistor is in a reversely-biased state (in the case that the photosensitive diode is in the reversely-biased state, a current (i.e., the fingerprint photocurrent) may flow from the cathode to the anode of the photosensitive diode, there is a non-linear relationship between the fingerprint photocurrent and a reversely-biased voltage of the photosensitive diode, and within a certain range of the reversely-biased voltage, a change in the reversely-biased voltage may not cause a change in the reverse current (i.e., the fingerprint photocurrent) flowing through the photosensitive diode), so the potential at G2 may decrease gradually due to the fingerprint photocurrent. In the case that the potential at G2 has been pulled down to a threshold voltage Vth of T2, T2 may be turned on, and the high level at G3 may be applied to the input end of the phase inversion module 31 via the on-state T2, so as to pull down the potential at G3 to the low level before a third stage.

At the third stage t3, the potential at the edge triggering end (i.e., G3) of the edge trigger 32 is at the falling edge, so the edge trigger 32 may output the high level, so as to turn on T1 again, charge Cst, and pull up the potential at G2 to Vdd. The signal controller may maintain the potential at G1 as the high level for the predetermined time period t0 before a fourth stage.

At the fourth stage t4, the signal controller may control the potential at G1 to be the low level. At this time, the photosensitive diode coupled to RL via the reading transistor is in the reversely-biased state, so the potential at G2 may decrease gradually due to the fingerprint photocurrent. In the case that the potential at G2 has been pulled down to the threshold voltage Vth of T2, T2 may be turned on, and the high level at G3 may be applied to the input end of the phase inversion module 31 via the on-state T2, so as to pull up the potential at G3 to the high level for a next period.

Through the repetition of the display periods, the potential at G3 may be a square wave as shown in FIG. 4. Due to different fingerprint photocurrents carrying fingerprint information, the second stages t2 may be maintained for different time periods, and so do the fourth stages t4. Finally, the waveforms of the potential at G3 may be provided with different frequencies, and so do the waveforms of the potential at G1. The fingerprint information may be acquired through measuring the frequencies of the waveforms of the potential at G3 and/or the frequencies of the waveforms of the potential at G1.

The present disclosure further provides in some embodiments a method for driving the above-mentioned fingerprint photocurrent detection unit which, as shown in FIG. 5, includes: Step S1 of, at a charging stage, controlling, by a detection control module, a potential at the first node to be a first level and a potential at a third node to be a high level or a low level, and controlling, by a first switching module, a high level line to be electrically coupled to a second node, so as to charge a storage module and pull up a potential at the second node to the high level; and Step S2 of, at a discharging stage, controlling, by the detection control module, the potential at the first node to jump to a second level, controlling, by the first switching module, the high level line to be electrically decoupled from the second node so as to enable a fingerprint photocurrent to flow from the second node, through a fingerprint photocurrent reading line and toward a reversely-biased photosensitive diode of a fingerprint touch unit and pull down the potential at the second node gradually until the second switching module is turned on, controlling, by a phase conversion module, the potential at the third node to jump to the low level or high level, controlling, by the detection control module, the potential at the first node to be reset as the first level, and acquiring, by a detection circuit, corresponding information about a fingerprint photocurrent in accordance with a frequency of a waveform of a potential at an output end of the phase inversion module and/or a frequency of a waveform of the potential at the first node.

The present disclosure further provides in some embodiments a fingerprint identifier which includes fingerprint photocurrent reading lines and the above-mentioned fingerprint photocurrent detection unit. A conversion circuit of the fingerprint photocurrent detection unit is coupled to the fingerprint photocurrent reading lines.

In a possible embodiment of the present disclosure, the fingerprint photocurrent reading lines are arranged in m columns, and the fingerprint identifier further includes fingerprint sensing units arranged in n rows and m columns, where n and m are both positive integers. Each fingerprint sensing unit includes a reading control transistor and a photosensitive diode. An anode of the photosensitive diode is coupled to a low level output end, and a cathode thereof is coupled to a first electrode of the reading control transistor. Gate electrodes of the reading control transistors of the fingerprint sensing units in each row are coupled to a corresponding gate line, and second electrodes of the reading control transistors of the fingerprint sensing units in each column are coupled to a corresponding fingerprint photocurrent reading line.

In actual use, as shown in FIG. 6, the fingerprint photocurrent reading lines RL may be arranged in m columns. The fingerprint identifier may further include the fingerprint sensing units arranged in n rows and m columns at the active display region of the display substrate, where n and m are both positive integers.

Each fingerprint sensing unit may include a reading control transistor and a photosensitive diode. An anode of the photosensitive diode is coupled to a low level output end VSS, and a cathode thereof is coupled to a source electrode of the reading control transistor.

Gate electrodes of the reading control transistors of the fingerprint sensing units in each row are coupled to a corresponding gate line, and drain electrodes of the reading control transistors of the fingerprint sensing units in each column are coupled to a corresponding fingerprint photocurrent reading line.

In FIG. 6, GATE1 represents a first gate line, GATE2 represents a second gate line, and GATEn represents an $n^{th}$ gate line. RL1 represents a first fingerprint photocurrent reading line, RL2 represents a second fingerprint photocurrent reading line, and RLm represents an $m^{th}$ fingerprint photocurrent reading line. TD11 represents a reading control transistor of a fingerprint sensing unit in a first row and a first column, and SD11 represents a photosensitive diode of the fingerprint sensing unit in the first row and the first column. TD12 represents a reading control transistor of a fingerprint sensing unit in the first row and a second column, and SD12 represents a photosensitive diode of the fingerprint sensing unit in the first row and the second column. TD1$m$ represents a reading control transistor of a fingerprint sensing unit in the first row and an $m^{th}$ column, and SD1$m$ represents a photosensitive diode of the fingerprint sensing unit in the first row and the $m^{th}$ column. TD21 represents a reading control transistor of a fingerprint sensing unit in a second row and the first column, and SD21 represents a photosensitive diode of the fingerprint sensing unit in the second row and the first column. TD22 represents a reading control transistor of a fingerprint sensing unit in the second row and a second column, and SD22 represents a photosensitive diode of the fingerprint sensing unit in the second row and the second column. TD2$m$ represents a reading control transistor of a fingerprint sensing unit in the second row and the $m^{th}$ column, and SD2$m$ represents a photosensitive diode of the fingerprint sensing unit in the second row and the $m^{th}$ column. TDn1 represents a reading control transistor of a fingerprint sensing unit in an $n^{th}$ row and the first column, and SDn1 represents a photosensitive diode of the fingerprint sensing unit in the $n^{th}$ row and the first column. TDnm represents a reading control transistor of a fingerprint sensing unit in the $n^{th}$ row and the $m^{th}$ column, and SDnm represents a photosensitive diode of the fingerprint sensing unit in the $n^{th}$ row and the $m^{th}$ column.

In a possible embodiment of the present disclosure, the fingerprint identifier further includes a multiplexer, an input end of which is coupled to the fingerprint photocurrent reading lines arranged in m columns, an output end of which is coupled to a control end of a second switching module of the fingerprint photocurrent detection unit, and a control end of which is coupled to a multiplex control line. The multiplexer is configured to control the fingerprint photocurrent reading lines arranged in m columns to be electrically coupled to the control end of the second switching module in a time-division manner under the control of a multiplex control signal from the multiplex control line.

As shown in FIG. 7, on the basis of FIG. 6, the fingerprint identifier may further include a multiplexer Mux, an input end of which is coupled to the fingerprint photocurrent reading lines arranged in m columns, an output end Muxout of which is coupled to the conversion circuit in FIG. 3A, i.e., the ring oscillator 30 in FIG. 7.

To be specific, the output end Muxout of the multiplexer may be coupled to the second node G2 in FIG. 3A, and a control end thereof may be coupled to a plurality of multiplex control lines. The multiplexer Mux may be configured to control the fingerprint photocurrent reading lines arranged in m columns to be electrically coupled to ring oscillator 30 in a time-division manner under the control of a multiplex control signal from the multiplex control line.

In FIG. 7, SW1 represents a first multiplex control line, SW2 represents a second multiplex control line, and SWn represents an $n^{th}$ multiplex control line.

Figure 8:
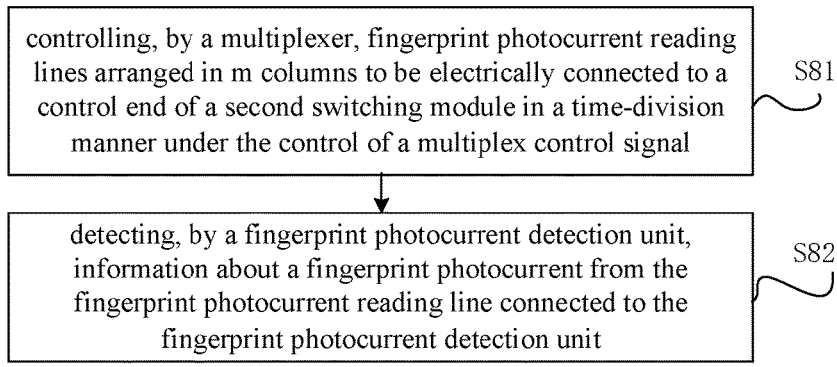
FIG. 8 is a flow chart of a method for driving the fingerprint identifier according to one embodiment of the present disclosure.

The present disclosure further provides in some embodiments a method for driving the above-mentioned fingerprint identifier which, as shown in FIG. 8, includes: a connection step S81 of controlling, by a multiplexer, fingerprint photocurrent reading lines arranged in m columns to be electrically coupled to a control end of a second switching module in a time-division manner under the control of a multiplex control signal; and a fingerprint photocurrent detection step S82 of detecting, by a fingerprint photocurrent detection unit, information about a fingerprint photocurrent from the fingerprint photocurrent reading line coupled to the fingerprint photocurrent detection unit.

The present disclosure further provides in some embodiments a display device including a display substrate and the above-mentioned fingerprint identifier arranged on the display substrate.

To be specific, the display substrate may be an LTPS display substrate, and the fingerprint identifier is arranged on the display substrate through an LTPS process.

In actual use, the display device may further include N groups fingerprint photocurrent reading lines arranged at an active display region of the display substrate, and each group of fingerprint photocurrent reading lines include the fingerprint photocurrent reading lines arranged in m columns, where m and N are both positive integers. There are N fingerprint identifiers, and each fingerprint identifier is coupled to the fingerprint photocurrent reading lines arranged in m columns.

In other words, during the implementation, there may exist N ring oscillators formed through the LTPS process beyond the active display region (region AA) of the display substrate, and there may also exist N multiplexers. The fingerprint photocurrent reading lines may be divided into N groups, and each group may include m fingerprint photocurrent read lines, which are coupled to one multiplexer. One of the multiplexers may be selected, so as to apply the voltage to the corresponding fingerprint photocurrent reading line. Each multiplexer may be coupled to one ring oscillator. A value of M depends on a size of the display substrate (the larger the size, the more the ring oscillators), detection time (the smaller the value of M, the less the detection time), and the number of the fingerprint photocurrent reading lines.

Figure 9:
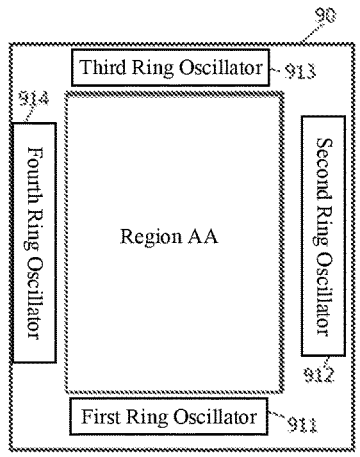
FIG. 9 is a schematic view showing a display device according to one embodiment of the present disclosure.

As shown in FIG. 9, the display device may include four ring oscillators formed through the LTPS process beyond the region AA of the display substrate 90, i.e., a first ring oscillator 911, a second ring oscillator 912, a third ring oscillator 913 and a fourth ring oscillator 914. In FIG. 9, the fourth ring oscillators are arranged at four sides of the display substrate 90 beyond the region AA.

In FIG. 9, a fanout region is located under the first ring oscillator 911, a Gate On Array (GOA) circuit is arranged between the second ring oscillator 912 and the region AA, and another GOA circuit is arranged between the fourth ring oscillator 914 and the region AA.

The above are merely the preferred embodiments of the present disclosure, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A fingerprint photocurrent detection unit, comprising:
a fingerprint photocurrent reading line;
a conversion circuit coupled to the fingerprint photocurrent reading line and configured to convert a fingerprint photocurrent acquired by the fingerprint photocurrent reading line into a square wave signal; and
a detection circuit coupled to the conversion circuit and configured to detect the square wave signal and acquire information about the fingerprint photocurrent in accordance with a frequency of the square wave signal,
wherein the conversion circuit comprises a detection control module, a first switching module, a second switching module, a phase inversion module and a storage module;
a control end of the first switching module is coupled to the detection control module and a first node, a first end of the first switching module is coupled to a high level line, and a second end of the first switching module is coupled to a control end of the second switching module; wherein the first switching module is configured to be turned on in the case that a potential at the first node is a first level, and turned off in the case that the potential at the first node is a second level;
a first end of the storage module is coupled to the second end of the first switching module, and a second end of the storage module is coupled to a low level line;
the control end of the second switching module is further coupled to the fingerprint photocurrent reading line and a second node, a first end of the second switching module is coupled to an output end of the phase inversion module, and a second end of the second switching module is coupled to an input end of the phase inversion module; wherein the second switching module is configured to be turned on in the case that a potential at the second node is a low level, and turned off in the case that the potential at the second node is a high level;
the output end of the phase inversion module is further coupled to a third node, and the phase inversion module is configured to invert a phase of a level applied to its input end and output a signal with the inverted phase;
the detection control module is coupled to the first node and the output end of the phase inversion module, and configured to, in the case that a detection operation starts and the signal from the output end of the phase inversion module is at a rising or falling edge, control the potential at the first node to be the first level, in the case that the potential at the first node is maintained as the first level for a predetermined time period, control the potential at the first node to jump to the second level, and in the case that the detection operation starts, control the potential at the third node to be the high level or the low level; and
the detection circuit is coupled to at least one of the output end of the phase inversion module and the first node, and further configured to detect at least one of a frequency of a waveform of a potential at the output end of the phase inversion module and a frequency of a waveform of the potential at the first node, and acquire the information about the fingerprint photocurrent in accordance with the frequency of the waveform of the potential at the output end of the phase inversion module and the frequency of the waveform of the potential at the first node.

2. The fingerprint photocurrent detection unit according to claim 1, wherein the first switching module comprises a first switching transistor, a gate electrode of which is coupled to the detection control module and the first node, a first electrode of which is coupled to the high level line, and a second electrode of which is coupled to the second node;
the second switching module comprises a second switching transistor, a, gate electrode of which is coupled to the fingerprint photocurrent reading line and the second node, a first electrode of which is coupled to the output end of the phase inversion module, and a second electrode of which is coupled to the input end of the phase inversion module;
the storage module comprises a storage capacitor, a first end of which is coupled to the second node, and a second end of which is coupled to the low level line;
the phase inversion module comprises A phase inverters coupled in series to each other, where A is an odd number and a positive integer;
an output end of an $a^{th}$ phase inverter is coupled to an input end of an $(a+1)^{th}$ phase inverter, where a is an integer greater than or equal to 1 and smaller than A; and
an input end of a first phase inverter is the input end of the phase inversion module, and an output end of an $A^{th}$ phase inverter is the output end of the phase inversion module.

3. The fingerprint photocurrent detection unit according to claim 2, wherein the first switching transistor is an n-type transistor, the second switching transistor is a p-type transistor, the first level is a high level, and the second level is a low level.

4. The fingerprint photocurrent detection unit according to claim 2, wherein the first switching transistor and the second switching transistor are p-type transistors, the first level is a low level, and the second level is a high level.

5. The fingerprint photocurrent detection unit according to claim 2, wherein the detection control module comprises an edge trigger and a signal controller;
an edge triggering end of the edge trigger is coupled to the output end of the phase inversion module, and an output end of the edge trigger is coupled to the first node;
the edge trigger is configured to, in the case that the detection operation starts, control the potential at the third node to be the high level or low level, and in the case that the signal from the output end of the phase inversion module is at the rising edge or falling edge, control the potential at the first node to be the first level; and
the signal controller is coupled to the first node, and configured to, in the case that the detection operation starts, control the potential at the first node to be the first level, and in the case that the potential at the first node is maintained as the first level for the predetermined time period, control the potential at the first node to jump to the second level.

6. A method for driving the fingerprint photocurrent detection unit according to claim 1, comprising steps of:
at a charging stage, controlling, by a detection control module, a potential at the first node to be a first level and a potential at a third node to be a high level or a low level, and controlling, by a first switching module, a high level line to be electrically coupled to a second node to charge a storage module and pull up a potential at the second node to the high level; and
at a discharging stage, controlling, by the detection control module, the potential at the first node to jump to a second level, controlling, by the first switching module, the high level line to be electrically decoupled from the second node to enable a fingerprint photocurrent to flow from the second node, through a fingerprint photocurrent reading line and toward a reversely-biased photosensitive diode of a fingerprint touch unit and pull down the potential at the second node gradually until the second switching module is turned on, controlling, by a phase conversion module, the potential at the third node to jump to the low level or high level, controlling, by the detection control module, the potential at the first node to be reset as the first level, and acquiring, by a detection circuit, corresponding information about a fingerprint photocurrent in accordance with at least one of a frequency of a waveform of a potential at an output end of the phase inversion module and a frequency of a waveform of the potential at the first node.

7. A fingerprint identifier, comprising the fingerprint photocurrent detection unit according to claim 1, wherein the conversion circuit of the fingerprint photocurrent detection unit is coupled to the fingerprint photocurrent reading lines.

8. The fingerprint identifier according to claim 7, wherein the fingerprint photocurrent reading lines are arranged in m columns, and the fingerprint identifier further comprises fingerprint sensing units arranged in n rows and m columns, where n and m are both positive integers;
each fingerprint sensing unit comprises a reading control transistor and a photosensitive diode;
an anode of the photosensitive diode is coupled to a low level output end, and a cathode thereof is coupled to a first electrode of the reading control transistor; and
gate electrodes of the reading control transistors of the fingerprint sensing units in each row are coupled to a corresponding gate line, and second electrodes of the reading control transistors of the fingerprint sensing units in each column are coupled to a corresponding fingerprint photocurrent reading line.

9. The fingerprint identifier according to claim 8, further comprising a multiplexer, an input end of which is coupled to the fingerprint photocurrent reading lines arranged in m columns, an output end of which is coupled to a control end of a second switching module of the fingerprint photocurrent detection unit, and a control end of which is coupled to a multiplex control line, wherein the multiplexer is configured to control the fingerprint photocurrent reading lines arranged in m columns to be electrically coupled to the control end of the second switching module in a time-division manner under the control of a multiplex control signal from the multiplex control line.

10. A method for driving the fingerprint identifier according to claim 9, comprising:
a connection step of controlling, by a multiplexer, fingerprint photocurrent reading lines arranged in m columns to be electrically coupled to a control end of a second switching module in a time-division manner under the control of a multiplex control signal; and
a fingerprint photocurrent detection step of detecting, by a fingerprint photocurrent detection unit, information about a fingerprint photocurrent from the fingerprint photocurrent reading line coupled to the fingerprint photocurrent detection unit.

11. A display device, comprising a display substrate and the fingerprint identifier according to claim 7 arranged on the display substrate.

12. The display device according to claim 11, wherein the display substrate is a Low Temperature Poly-Silicon (LTPS) display substrate, and the fingerprint identifier is arranged on the display substrate through an LTPS process.

13. The display device according to claim 11, further comprising N groups fingerprint photocurrent reading lines arranged at an active display region of the display substrate, wherein
each group of fingerprint photocurrent reading lines comprise the fingerprint photocurrent reading lines arranged in m columns, where m and N are both positive integers; and
there are N fingerprint identifiers, and each fingerprint identifier is coupled to the fingerprint photocurrent reading lines arranged in m columns.

14. The fingerprint identifier according to claim 7, wherein the first switching module comprises a first switching transistor, a gate electrode of which is coupled to the detection control module and the first node, a first electrode of which is coupled to the high level line, and a second electrode of which is coupled to the second node;
the second switching module comprises a second switching transistor, a, gate electrode of which is coupled to the fingerprint photocurrent reading line and the second node, a first electrode of which is coupled to the output end of the phase inversion module, and a second electrode of which is coupled to the input end of the phase inversion module;
the storage module comprises a storage capacitor, a first end of which is coupled to the second node, and a second end of which is coupled to the low level line;
the phase inversion module comprises A phase inverters coupled in series to each other, where A is an odd number and a positive integer;
an output end of an $a^{th}$ phase inverter is coupled to an input end of an $(a+1)^{th}$ phase inverter, where a is an integer greater than or equal to 1 and smaller than A; and
an input end of a first phase inverter is the input end of the phase inversion module, and an output end of an $A^{th}$ phase inverter is the output end of the phase inversion module.

15. The fingerprint identifier according to claim 14, wherein the first switching transistor is an n-type transistor, the second switching transistor is a p-type transistor, the first level is a high level, and the second level is a low level.

16. The fingerprint identifier according to claim 14, wherein the first switching transistor and the second switching transistor are p-type transistors, the first level is a low level, and the second level is a high level.

17. The fingerprint identifier according to claim 14, wherein the detection control circuit comprises an edge trigger and a signal controller;
an edge triggering end of the edge trigger is coupled to the output end of the phase inversion module, and an output end of the edge trigger is coupled to the first node;
the edge trigger is configured to, in the case that the detection operation starts, control the potential at the third node to be the high level or low level, and in the case that the signal from the output end of the phase inversion circuit is at the rising edge or falling edge, control the potential at the first node to be the first level; and
the signal controller is coupled to the first node, and configured to, in the case that the detection operation starts, control the potential at the first node to be the first level, and in the case that the potential at the first node is maintained as the first level for the predetermined time period, control the potential at the first node to jump to the second level.

* * * * *